United States Patent
Yun et al.

(10) Patent No.: US 10,203,369 B2
(45) Date of Patent: Feb. 12, 2019

(54) TEST BOARD, TEST EQUIPMENT, TEST SYSTEM, AND TEST METHOD

(71) Applicant: SAMSUNG ELECTRONICS CO., LTD., Suwon-si, Gyeonggi-do (KR)

(72) Inventors: Joo-sung Yun, Asan-si (KR); Ki-jae Song, Cheonan-si (KR); Ung-jin Jang, Daejeon (KR); Woon-sup Choi, Asan-si (KR); Jae-hyun Kim, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 319 days.

(21) Appl. No.: 15/089,605

(22) Filed: Apr. 4, 2016

(65) Prior Publication Data
US 2017/0023638 A1 Jan. 26, 2017

(30) Foreign Application Priority Data
Jul. 23, 2015 (KR) .................. 10-2015-0104356

(51) Int. Cl.
*G01R 31/28* (2006.01)
*G01R 31/319* (2006.01)

(52) U.S. Cl.
CPC ... *G01R 31/2889* (2013.01); *G01R 31/31926* (2013.01)

(58) Field of Classification Search
CPC ............ G01R 31/2889; G01R 31/31926
See application file for complete search history.

(56) References Cited

U.S. PATENT DOCUMENTS

| | | | |
|---|---|---|---|
| 4,769,723 A | | 9/1988 | Tran |
| 4,899,350 A | * | 2/1990 | Kage ............... H04B 14/064 370/527 |
| 5,231,598 A | * | 7/1993 | Vlahos ............ G01R 31/31725 324/76.82 |
| 5,905,759 A | | 5/1999 | Ishida et al. |
| 6,950,567 B2 | | 9/2005 | Kline |
| 7,148,799 B2 | | 12/2006 | Cern et al. |
| 7,957,464 B2 | | 6/2011 | Yamazaki |
| 8,064,873 B2 | | 11/2011 | Wu et al. |
| 8,811,547 B2 | | 8/2014 | Fazzi et al. |
| 9,692,476 B2 | * | 6/2017 | Gundel ............... H05K 1/0239 |
| 9,985,732 B2 | * | 5/2018 | Cordier ............... G06K 7/0095 |

(Continued)

FOREIGN PATENT DOCUMENTS

| | | |
|---|---|---|
| JP | 2006-254202 A | 9/2006 |
| JP | 2013-085445 A | 5/2013 |

(Continued)

OTHER PUBLICATIONS

Forster, "Manchester Encoding: Opposing Definitions Resolved" Engineering Science and Education Journal (2000) pp. 278-280.

*Primary Examiner* — Laura Menz
(74) *Attorney, Agent, or Firm* — Lee & Morse P.C.

(57) ABSTRACT

A test interface board includes an encoder, a signal copier, and a decoder. The encoder digitally encodes test data to generate a modulation signal. The signal copier copies the modulation signal by inductively coupling the modulation signal and outputs at least one copy signal corresponding to the modulation signal. The decoder decodes the modulation signal and the at least one copy signal in order to test at least two semiconductor devices.

11 Claims, 18 Drawing Sheets

(56) References Cited

U.S. PATENT DOCUMENTS

| | | | |
|---|---|---|---|
| 2005/0077905 A1* | 4/2005 | Sasaki | G01R 1/045 |
| | | | 324/500 |
| 2012/0201326 A1 | 8/2012 | Burns et al. | |
| 2013/0082516 A1 | 4/2013 | Yamaguchi | |
| 2014/0169507 A1 | 6/2014 | Shimada | |
| 2015/0085903 A1* | 3/2015 | Gundel | H05K 1/0239 |
| | | | 375/219 |
| 2017/0023638 A1* | 1/2017 | Yun | G01R 31/31926 |
| 2017/0163357 A1* | 6/2017 | Cordier | G06K 7/0095 |

FOREIGN PATENT DOCUMENTS

| | | |
|---|---|---|
| KR | 10-2001-0007341 A | 1/2001 |
| KR | 20-0334548 Y1 | 11/2003 |
| KR | 10-0560616 B1 | 3/2006 |
| KR | 10-2007-0101202 A | 10/2007 |

\* cited by examiner

TEST BOARD, TEST EQUIPMENT, TEST SYSTEM, AND TEST METHOD

CROSS-REFERENCE TO RELATED APPLICATION

Korean Patent Application No. 10-2015-0104356, filed on Jul. 23, 2015, and entitled, "Test Board, Test Equipment, Test System, and Test Method," is incorporated by reference herein in its entirety.

BACKGROUND

1. Field

One or more embodiments relate to a test board, test equipment, a test system, and a test method.

2. Description of the Related Art

A signal distribution method whereby one signal is applied to multiple semiconductor devices is used to test an increased number of semiconductor devices at the same time using limited resources. However, as a frequency of a test signal which is a test pattern is increased, it is difficult to perform signal distribution while maintaining signal characteristics.

SUMMARY

In accordance with one or more embodiments, a test interface board includes an encoder to digitally encode test data and output a modulation signal; a signal copier to copy the modulation signal by inductively coupling the modulation signal and to output at least one copy signal corresponding to the modulation signal; and a decoder to decode the modulation signal and the at least one copy signal to test at least two semiconductor devices. The test interface board may also include a Device Under Test (DUT) board which includes the at least two semiconductor devices, wherein the encoder, the signal copier, and the decoder are in the DUT board. The encoder may encode the test data by Manchester encoding.

The signal copier may include a first signal line, patterned on a layer of the DUT board, to transmit the modulation signal; and at least one second signal line, wherein a portion of the at least one second signal line has a first length and is parallel to the first signal line, wherein the portion is patterned on another layer of the DUT board, and wherein the at least one copy signal is induced via the at least one second signal line based on a change in a magnetic field of the first signal line. The first length may be fixed regardless of a signal frequency of the test data. Impedance of the first signal line may be substantially equal to the impedance of the at least one second signal line. The test interface board may include a DUT board including the at least two semiconductor devices; and a mother board including the encoder, the signal copier, and the decoder.

In accordance with one or more other embodiments, a test system includes an automatic tester to transmit, via a channel, test data to test at least two semiconductor devices, wherein: the semiconductor device is mounted on a test interface board, and the test data is phase-modulated and applied via inductive coupling to the at least two semiconductor devices. The at least two semiconductor devices may be mounted on the test interface board, and the test interface board may include a first encoder to digitally encode the test data by phase-modulation and to output the encoded test data as a modulation signal; a first signal copier to copy the modulation signal by inductively coupling the modulation signal and to output at least one copy signal identical to the modulation signal; and a first decoder to decode the modulation signal and the at least one copy signal and to transmit decoded signals respectively corresponding to the modulation signal and the at least one copy signal to the at least two semiconductor devices.

The first signal copier may copy the modulation signal and outputs n−1 copy signals identical to the modulation signal, where n≥2, and, a number of semiconductor devices at a same time may be equal to n times the number of channels.

The first signal copier may include a first signal line to transmit the modulation signal; and at least one second signal line, wherein a portion of the at least one second signal line may have a first length and is parallel to the first signal line, wherein the portion may be patterned, and wherein the at least one copy signal may be induced, via the at least one second signal line, based on a change in a magnetic field of the first signal line. The first length may be fixed, regardless of a signal frequency of the test data. The first encoder may encode the test data by Manchester encoding.

The automatic test equipment may include a second encoder to digitally encode the test data by phase-modulation and to output the encoded test data as a modulation signal; a second signal copier to copy the modulation signal by inductively coupling the modulation signal and to output as at least one copy signal identical to the modulation signal; and a second decoder to decode the modulation signal and the at least one copy signal and to transmit decoded signals respectively corresponding to the modulation signal and the at least one copy signal to each of at least two channels.

The second signal copier may include a first signal line to transmit the modulation signal; and at least one second signal line, wherein a portion of the at least one second signal has a first length and is parallel to the first signal line, wherein the portion is patterned, and wherein the at least one copy signal is induced, via the at least one second signal line, based on a change in a magnetic field of the first signal line. The first length may be fixed regardless of a signal frequency of the test data. The second encoder may encode the test data by Manchester encoding.

The test system may include a third encoder to receive the test data via the channel, digitally encode the test data by phase-modulation, and output the encoded test data as a modulation signal; a third signal copier to copy the modulation signal by inductively coupling the modulation signal and to output at least one copy signal identical to the modulation signal; and a third decoder to decode the modulation signal and the at least one copy signal. The third signal copier may copy the modulation signal and outputs n−1 copy signals identical to the modulation signal, a number of channels electrically connecting the third decoder and the test interface board is n times a number of channels electrically connecting the automatic test equipment and the third encoder.

The test interface board may include first encoder to digitally encode a signal received from the first decoder using a first digital encoding method and to output the encoded signal as a first modulation signal, the first digital encoding method including phase-modulation; a first signal copier to copy the first modulation signal by inductively coupling the first modulation signal and output at least one first copy signal identical to the first modulation signal; and a first decoder to decode the first modulation signal and the at least one first copy signal and to transmit decoded signals respectively corresponding to the first modulation signal and the at least one first copy signal to the at least two semiconductor devices.

The automatic test equipment may include a second encoder to digitally encode the test data using a second digital encoding method and to output the encoded test data as a second modulation signal, the second digital encoding method including phase modulation; a second signal copier to copy the second modulation signal by inductively coupling the second modulation signal and to output at least one second copy signal identical to the second modulation signal; and a second decoder to decode the second modulation signal and the at least one second copy signal and to transmit decoded signals respectively corresponding to the second modulation signal and the at least one second copy signal to each of at least two channels. The first and second digital encoding methods may be identical.

In accordance with one or more other embodiments, a test method includes digitally encoding test data by phase-modulating the test data; copying the phase-modulated test data by inductive coupling, outputting at least one piece of copy data identical to the phase-modulated test data; decoding the phase-modulated test data and the at least one piece of copy data; transmitting data, obtained by the decoding, to at least two semiconductor devices to be tested, and testing the at least two semiconductor devices. Digital encoding the test data may include exclusive-ORing the test data with a clock synchronized with the test data.

Copying the phase-modulated test data may include supplying the phase-modulated test data to a first signal line; and inducing from the first signal line to a second signal line according to a change in a magnetic field of the first signal line, wherein a portion of the second signal line has a first length and is parallel to the first signal. The test method may include receiving test data; and outputting a result of testing the at least two semiconductor devices.

In accordance with one or more other embodiments, an apparatus includes an encoder to digitally encode test data to generate a modulation signal; a signal copier to generate a copy signal by inductive coupling the modulation signal; and a decoder to decode the modulation signal and the copy signal for testing at least two semiconductor devices, wherein the signal copier includes: a first signal line to transmit the modulation signal; and at least one second signal line including a portion having a first length parallel to the first signal line, the copy signal to be inductively coupled via the second signal line based on a change in a magnetic field of the first signal line. The first length may be fixed regardless of a signal frequency of the test data. Impedance of the first signal line may be substantially equal to the impedance of the second signal line. The encoder may encode the test data by Manchester encoding.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
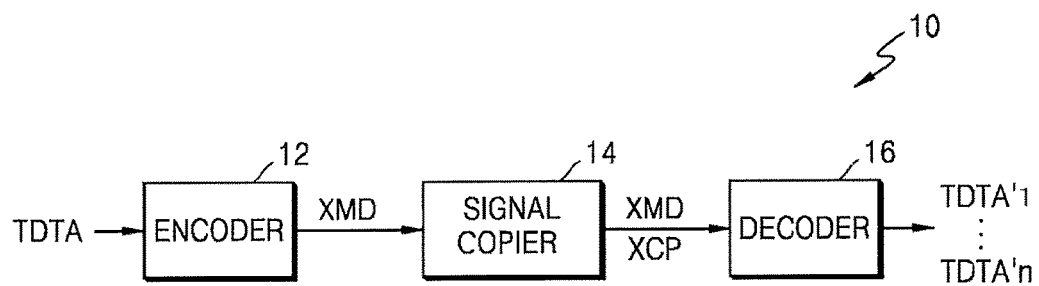
FIG. 1 illustrates an embodiment of a test interface board.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features disclosed in the specification, and are not intended to preclude the possibility that one or more other features may exist or may be added. As used herein, the term "and/or" includes any and all combinations of one or more of the associated listed items. In the present specification, terms such as 'first', 'second', etc. are used to describe various features and used only for distinguishing one feature from another, and the features are not limited by the terms. Thus, when a first feature is described as being connected or coupled to a second feature, a third feature between the first and second features is not precluded.

Unless defined differently, all terms used in the description including technical and scientific terms have the same meaning as generally understood by those skilled in the art. Terms as defined in a commonly used dictionary should be construed as having the same meaning as in an associated technical context, and unless defined apparently in the description, the terms are not ideally or excessively construed as having formal meaning. Expressions such as "at least one of," when preceding a list of elements, modify the entire list of elements and do not modify the individual elements of the list.

FIG. 1 illustrates an embodiment of a test interface board 10 which includes an encoder 12, a signal copier 14, and a decoder 16. The encoder 12 digitally encodes test data TDTA and outputs the encoded test data as a modulation signal XMD. The encoder 12 may phase-modulate the test data TDTA using at least one of various digital encoding methods.

Figure 2A:
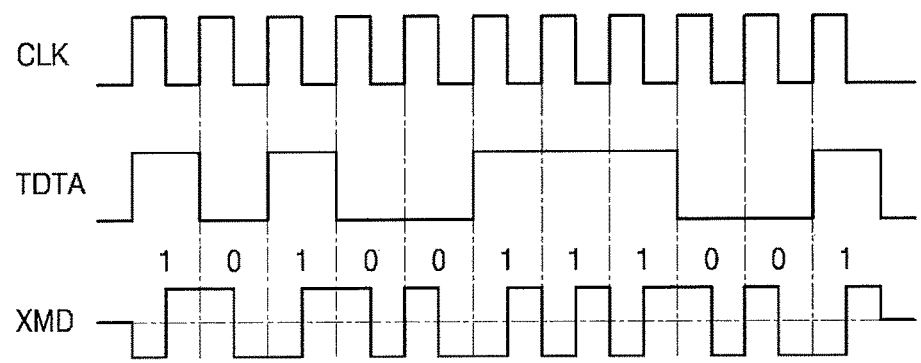
FIGS. 2A to 2C illustrate examples of a digital encoding methods.
Figure 2B:
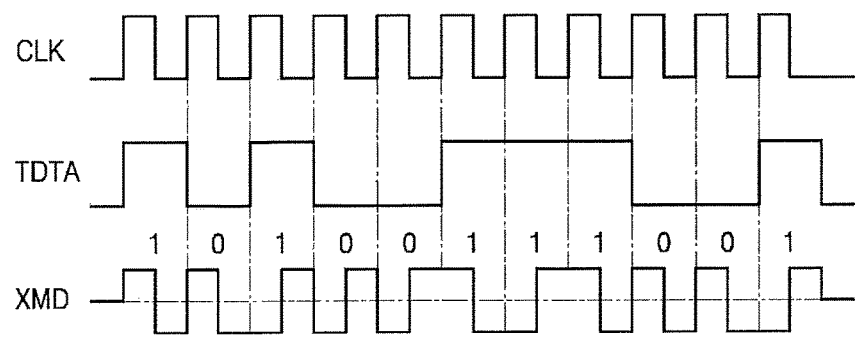
Figure 2C:
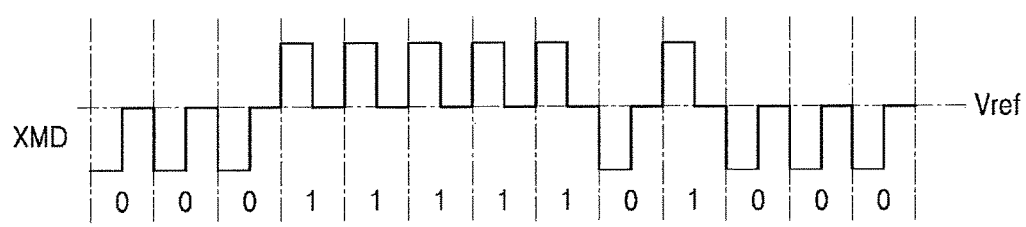

FIGS. 2A to 2C illustrate examples of digital encoding methods that may be performed in the encoder 12 of FIG. 1. Referring to FIGS. 1 and 2A, the encoder 12 may modulate test data TDTA to form a modulation signal XMD using a Manchester encoding method. In the Manchester encoding method, the phase of test data TDTA is modulated by exclusive-ORing a clock CLK and test data TDTA.

Figure 3:
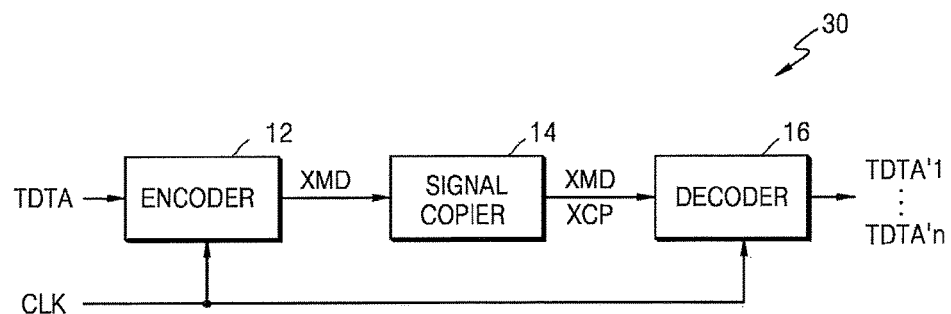
FIG. 3 illustrates another embodiment of a test interface board.

FIG. 3 illustrates an embodiment of a test interface board 30 in which a clock CLK is applied to the encoder 12. The clock CLK may also be applied to the decoder 16. According to the Manchester encoding method, test data TDTA may be modulated to a modulation signal XMD, in which test data is modulated to 0 or 1 corresponding to an opposite polarity of a previous polarity of the test data TDTA.

In another embodiment, referring to FIGS. 1 and 2B, the encoder 12 may modulate test data TDTA to a modulation signal XMD using a differential Manchester encoding method. Like Manchester encoding method, in the differential Manchester encoding method, test data TDTA is transitioned to an opposite polarity among 0 and 1, but no transition occurs at the start of 1 but only at the start of 0.

In another embodiment, referring to FIGS. 1 and 2C, the encoder 12 may modulate test data TDTA to a modulation signal XMD using a Return to Zero (RZ) encoding method. According to the RZ encoding method, test data TDTA is modulated to a modulation signal XMD, that is transitioned to a reference voltage Vref corresponding to 0 or 1.

A DC component may be removed from test data TDTA in the above-described manner. Even though a value of the test data TDTA is varied, the test data TDTA may be modulated to a modulation signal XMD having a uniform frequency. The encoder 12 may modulate test data TDTA to a modulation signal XMD that is obtained by removing a DC component from the test data TDTA and that has a uniform frequency despite a variation in a value of the test data TDTA.

Referring to FIG. 1, the signal copier 14 may inductively couple the modulation signal XMD and output at least one copy signal XCP identical to the modulation signal XMD. The copy signal XCP may be generated in the same manner as the modulation signal XMD.

FIGS. 4A to 4E illustrate examples of the signal copier 14 of FIG. 1.

Figure 4A:
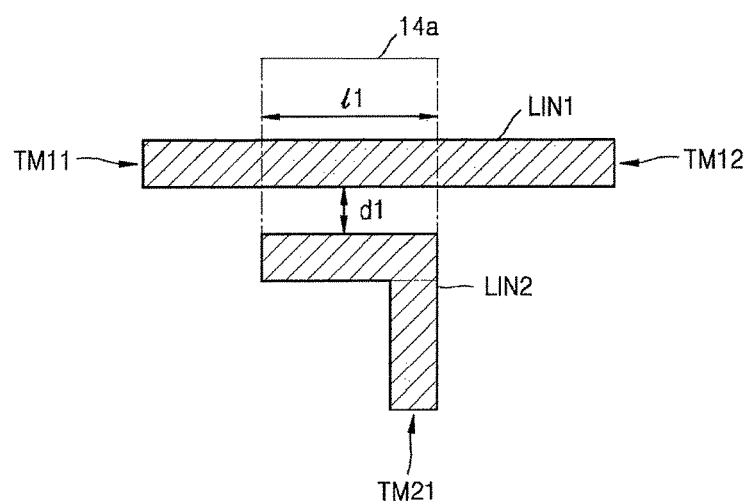
FIGS. 4A to 4E illustrate examples of a signal copier.

Referring to FIGS. 1 and 4A, signal copier 14a includes a first signal line LIN1 through which a modulation signal XMD is transmitted and a second signal line LIN2 from which a copy signal XCP is induced based on a change in magnetic field of the first signal line LIN1. The change in the magnetic field of the first signal line LIN1 may be caused by applying modulation signal XMD to the first signal line LIN1. The first signal line LIN1 and the second signal line LIN2 may be, for example, metallic signal lines patterned on a predetermined layer of the test interface board 10. The predetermined layer of the test interface board 10 may be, for example, one of a plurality of layers of a DUT board DBD.

The first signal line LIN1 includes a first terminal TM11 electrically connected to the encoder 12 and a second terminal TM12 electrically connected to the decoder 16. The second signal line LIN2 includes a first terminal TM21 electrically connected to the decoder 16. The decoder 16 may be included for each of the first signal line LIN1 and the second signal line LIN2. For example, a decoder 16 decoding a modulation signal XMD of the first signal line LIN1 and a decoder 16 decoding a copy signal XCP of the second signal line LIN2 may be respectively included.

The first signal line LIN1 and the second signal line LIN2 in the signal copier 14a may overlap each other by a first length 11 and may be spaced apart from each other by a first distance d1. The first length 11 may correspond to ¼ of a wavelength of a modulation signal XMD. In one embodiment, the modulation signal XMD may have a frequency that is uniform regardless of the value of test data TDTA, so that the first length 11 may be fixed regardless of the value of the test data TDTA. The first length 11 used for inductive coupling may be reduced as frequency increases.

Accordingly, tests based on the test data TDTA having various values may be performed using the signal copier 14a having a single length, that is, the first length 11. Also, by copying a signal via inductive coupling, identical impedance is set with respect to the first signal line LIN1 and the second signal LIN2 so that signal copying is accurately performed. Impedance with respect to both the first signal line LIN1 and the second signal LIN2 may be, for example, 50Ω.

Figure 4B:
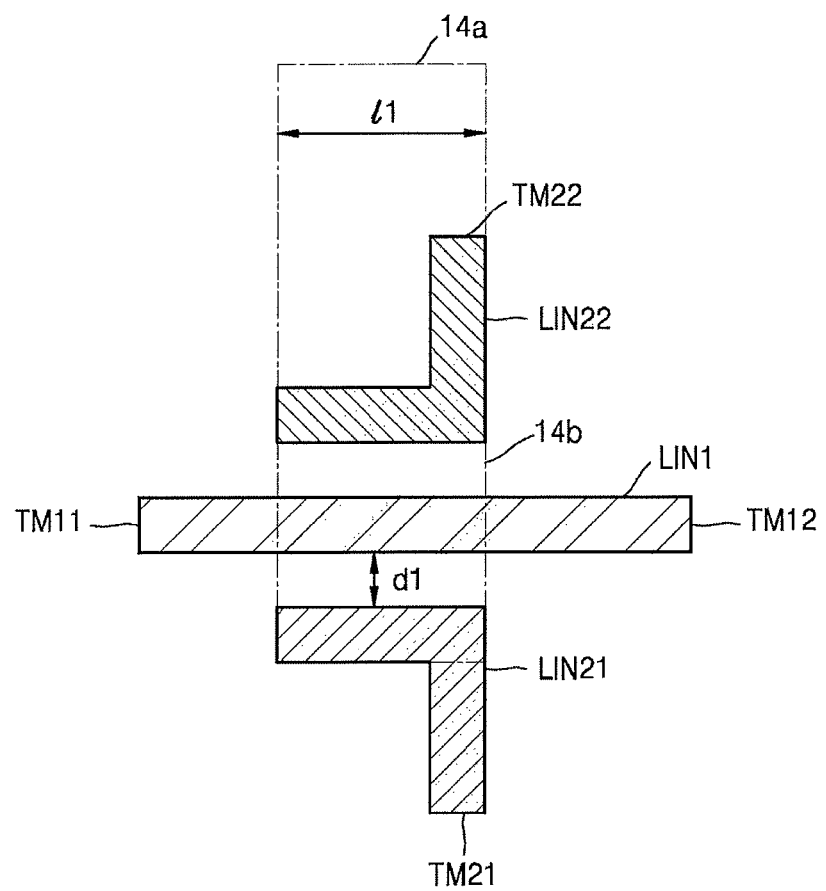
Figure 4C:
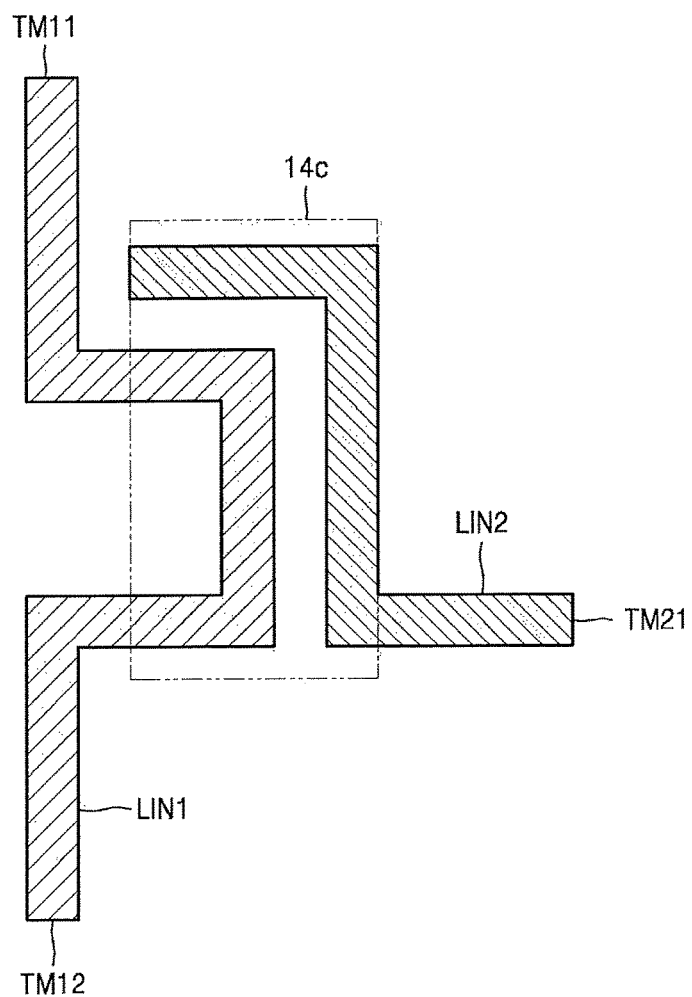
Figure 4D:
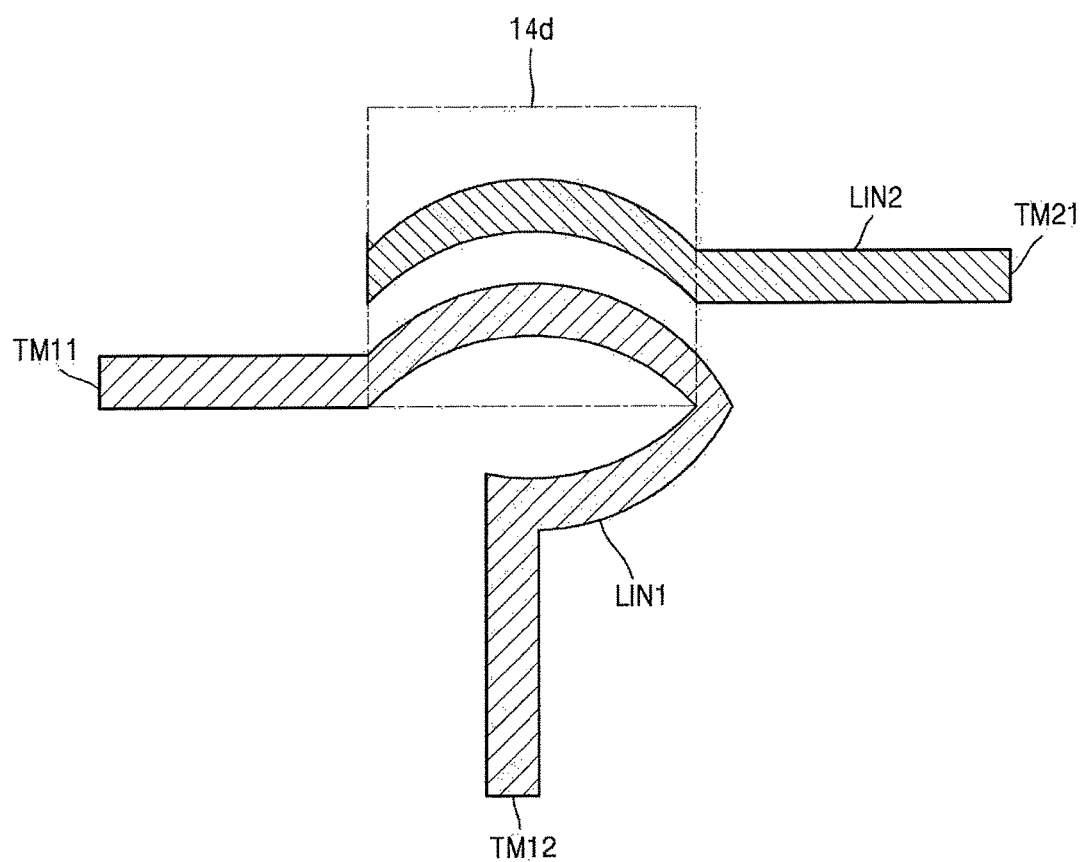

Referring to FIG. 4B, signal copier 14b includes two second signal lines LIN21 and LIN22, and one modulation signal XMD may be copied as two copy signals. Unlike FIG. 4B, in another embodiment three or more second signal lines LIN2 may be included. Also, while the first signal line LIN1 and the second signal LIN2 of signal copier 14a of FIG. 4A have a linear shape. For example, Referring to FIG. 4C, signal copier 14c includes a first signal line LIN1 and a second signal line LIN2, each including at least one bent portion. Referring to FIG. 4D, signal copier 14d includes a first signal line LIN1 and a second signal line LIN2 that are curved.

Figure 4E:
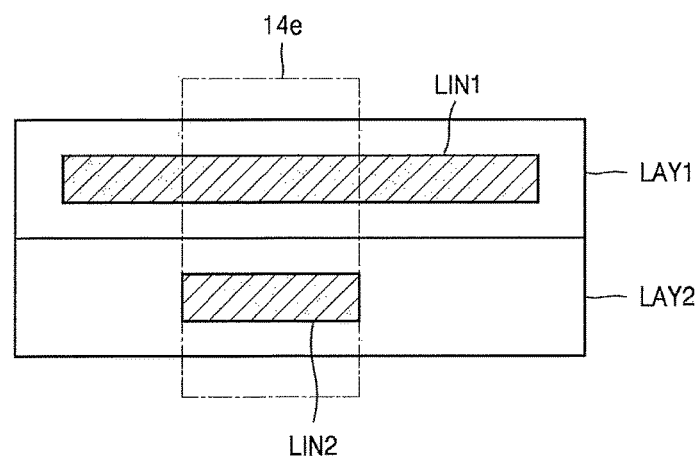

Referring to FIG. 4E, signal copier 14e includes a first signal line LIN1 and a second signal line LIN2 formed on different layers, e.g., first signal Line LIN1 is formed on a first layer LAY1 and second signal Line LIN2 is formed on a second layer LAY2.

Referring again to FIG. 1, the decoder 16 decodes each of the modulation signal XMD and the copy signal XCP to demodulate the same to test data TDTA'1 through TDTA'n. Test data TDTA obtained by demodulating may have a different reference numeral to be distinguished from the test data TDTA applied to test interface board 10.

Figure 5A:
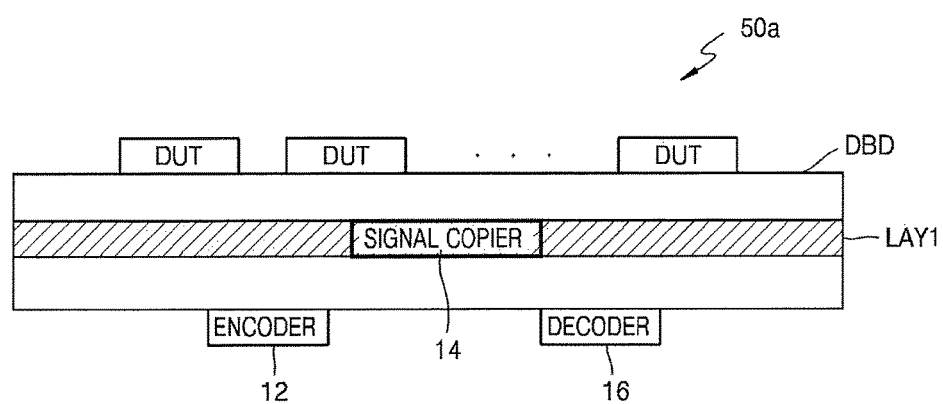
FIGS. 5A to 5C illustrate other embodiments of a test interface board.
Figure 5B:
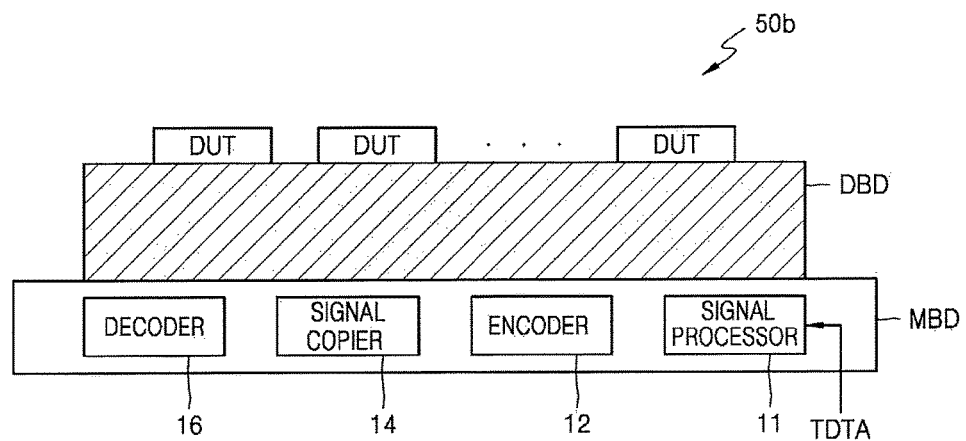
Figure 5C:
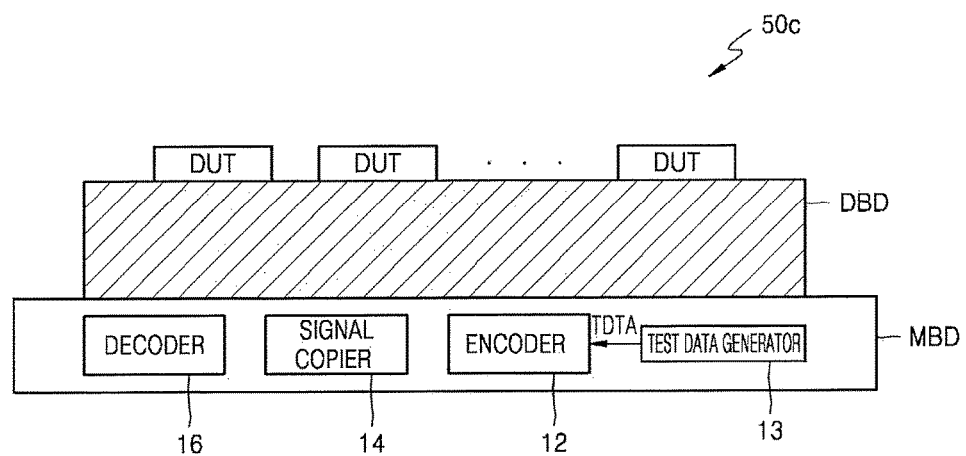

FIGS. 5A to 5C illustrate embodiments of a test interface board.

Referring to FIG. 5A, test interface board 50a includes a DUT board DBD having a surface which includes one or more Devices Under Test (DUT). The DUTs may be, for example, semiconductor devices to be tested. In FIG. 5A, multiple DUTs corresponding to the same type of semiconductor device (e.g., a memory device) to be tested are mounted on the DUT board DBD.

The encoder 12 and the decoder 16 described above may be on or adjacent to another (e.g., an opposing) surface of the DUT board BDB. The DUT board BDB may be a printed circuit board (PCB). A signal line and a power line, or the like, may be patterned on the DUT board DBD. The signal copier 14 may be formed on a first layer LAY1. The DUT board DBD may further include a connector and a buffer or the like. Because the encoder 12, the signal copier 14, and the decoder 16 are on or adjacent to the DUT board DBD, a signal distribution method through inductive coupling according to the present embodiment may be easily incorporated into a test system.

Referring to FIG. 5B, test interface board 50b includes a DUT board DBD and a mother board MBD. The DUT board DBD has a surface which includes one or more DUT, which, for example, may be semiconductor devices to be tested. The mother board MBD has a surface on which the DUT board DBD is mounted. The encoder 12, the signal copier 14, and the decoder 16 may be included inside or on mother board MBD.

In one embodiment, the encoder 12 and the decoder 16 may be formed on a surface of the mother board MBD in a manner similar to the DUT board DBD of FIG. 5A. The signal copier 14 may be formed on one layer of the mother board MBD. The mother board MBD may further include a signal processor 11 which adjusts the timing, noise, skew, and/or another parameter of test data TDTA received from an external source and which then transmits the test data TDTA to encoder 12 or DUT board DBD.

Referring to FIG. 5C, in one embodiment test data TDTA may be generated in a test interface board 50c. In this case, a mother board MBD may include a test data generator 13. Because the encoder 12, the signal copier 14, and the decoder 16 are included in the mother board MBD, a signal distribution method through inductive coupling may be commonly applied to test different DUTs.

Figure 6:
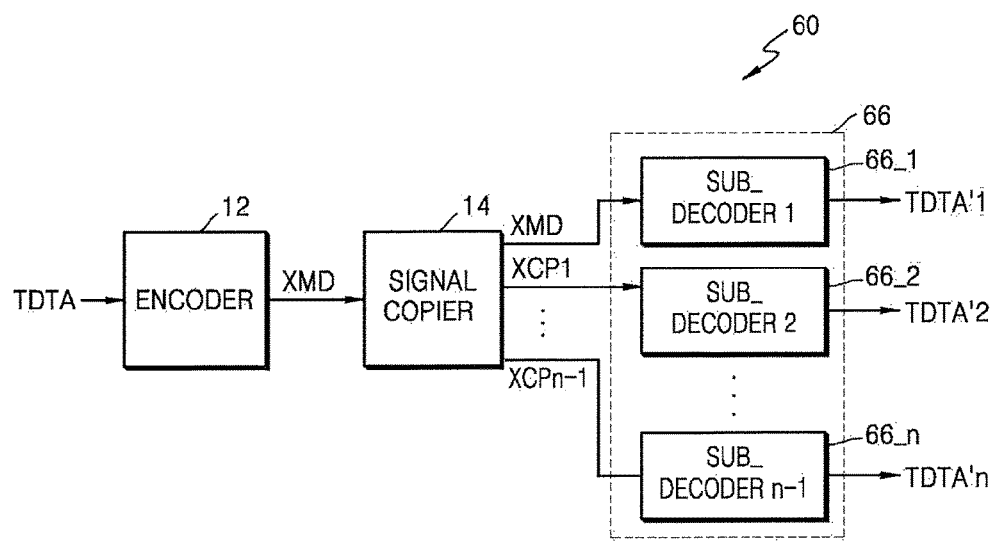
FIG. 6 illustrates another embodiment of a test interface board.

FIG. 6 illustrates an embodiment of a test interface board 60 which includes an encoder 12, a signal copier 14, and a decoder 66. The encoder 12 may digitally encode text data TDTA (e.g., by Manchester encoding of FIG. 2A or another method) to output the same as a modulation signal XMD. The signal copier 14 inductively couples the modulation signal XMD and outputs at least one copy signal identical to the modulation signal XMD, for example, copy signals XCP1 through XCPn−1. The decoder 66 decodes each of the modulation signal XMD and the copy signals XCP1 through XCPn−1 to demodulate the same to test data TDTA'1 through TDTA'n.

The decoder 66 of FIG. 6 may include sub-decoders 66_1 through 66_n-1 that decode corresponding signals among the modulation signal XMD and the copy signals XCP1 through XCPn−1. For example, the decoder 66 may include a first sub-decoder 66_1 decoding a modulation signal XMD to first test data TDTA'1, a second decoder 66_2 decoding a first copy signal XCP1 to second test data TDTA'2, . . . , and an nth sub-decoder 66_n decoding an (n−1)th copy signal XCPn−1 to nth test data TDTA'n. As described above, the first through nth test data TDTA'1 through TDTA'n have the same value as the test data TDTA applied to the encoder 12, but is labeled differently to be distinguished from the test data TDTA.

Figure 7:
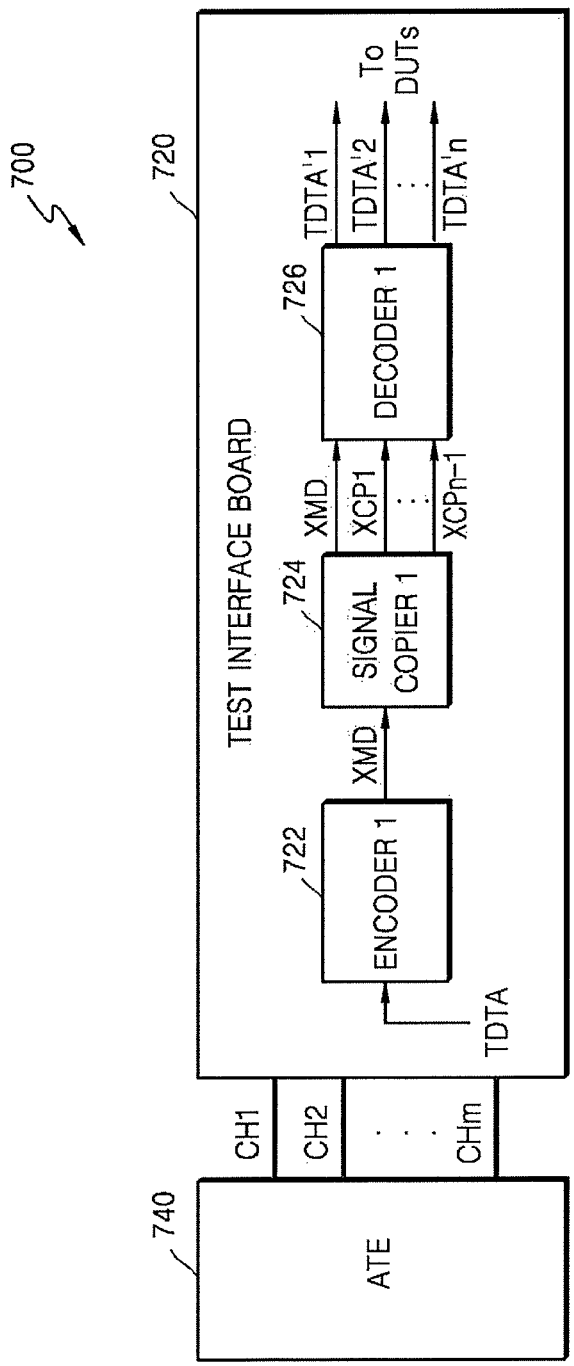
FIG. 7 illustrates an embodiment of a test system.

FIG. 7 illustrates an embodiment of a test system 700 which includes a test interface board 720 and an Automatic Test Equipment (ATE) 740. The test interface board 720 may be separated from the test system 700 in another embodiment. This also applies to other test systems according to exemplary embodiments.

Referring to FIG. 7, a semiconductor device to be tested is mounted on the test interface board 720. Power is supplied to a power terminal of the semiconductor device to be tested, via the test interface board 720. The test data TDAT'1 through TDTA'n obtained by demodulating may be applied to a data terminal of the semiconductor device to be tested, via the test interface board 720. The test interface board 720 may include a connector for communicating with the ATE 740, and may include a buffer to temporarily store a signal or data received from the ATE 740. In addition, the test interface board 720 may perform signal processing for adjusting timing, noise, skew, and/or another parameter with respect to test data TDTA which may be received from the ATE 740.

The test interface board 720 includes a first encoder 722, a first signal copier 724, and a first decoder 726. The first encoder 722 may digitally encode test data TDTA (e.g., by Manchester encoding of FIG. 2A or another method) and output the same as a modulation signal XMD. The first signal copier 724 inductively couples the modulation signal XMD to copy the same as at least one copy signal, that is, copy signals XCP1 through XCPn−1. The first decoder 726 decodes each of the modulation signal XMD and the copy signals XCP1 through XCPn−1 to demodulate the same to test data TDAT'1 through TDTA'n. Each piece of the test data TDAT'1 through TDTA'n obtained by demodulating is applied to the semiconductor device to be tested, that is, to a DUT.

The ATE 740 may transmit test data TDTA for testing a semiconductor device to the test interface board 720 via channels CH1 through CHn. In one embodiment, the test data TDTA may be transmitted to each of the channels CH1 through CHn at a predetermined point in time. In another embodiment, the test data TDTA may be generated inside the test interface board 720. The ATE 740 may apply power to the test interface board 720 via an additional power line. In another embodiment, the test interface board 720 may include a power supply circuit which generates power.

Figure 8:
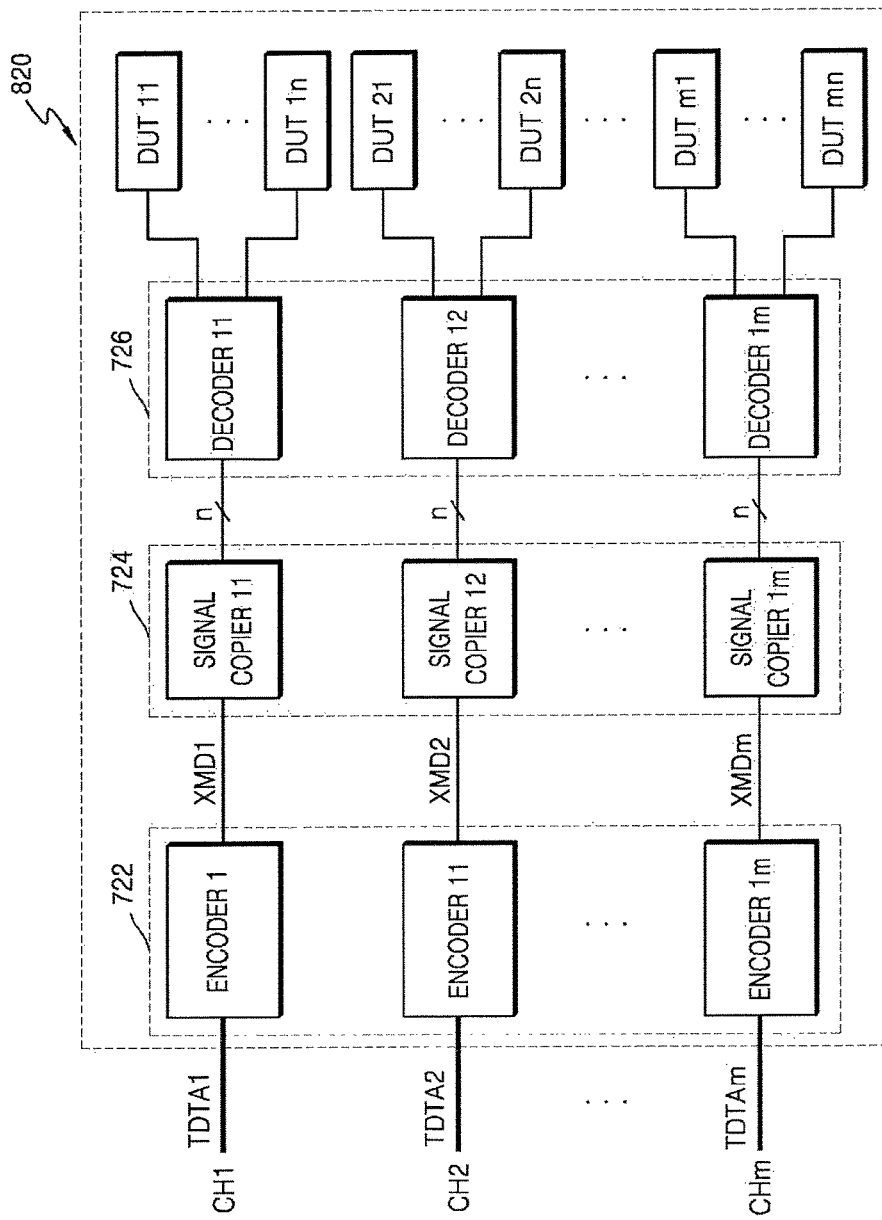
FIG. 8 illustrates another embodiment of a test interface board.

FIG. 8 illustrates an embodiment of a test interface board 820 which is an example of the test interface board 720 of FIG. 7. Referring to FIG. 8, the test interface board 820 includes a first encoder 722, a first signal copier 724, and a first encoder 726.

The first encoder 722 may perform encoding by Manchester encoding of FIG. 2A or another method. The first encoder 722 may be included for each channel. For example, the encoder 722 may include an encoder 11 encoding first test data TDTA1 transmitted through a first channel CH1, an encoder 12 encoding second test data TDTA2 transmitted through a second channel CH2, . . . , and an encoder 1m encoding mth test data TDTAm transmitted through an mth channel CHm (m is an integer equal to or greater than 2).

The first signal copier 724 copies modulation signals XMD1 through XMDm, each of which is modulated using the first encoder 722, by inductive coupling. For example, the first signal copier 724 may include a signal copier 11 copying a first modulation signal XMD1, a signal copier 21 copying a second modulation signal XMD2, . . . , and a signal copier 1m copying an mth modulation signal XMDm. The first signal copier 724 may copy the modulation signal XMD and output (n−1) copy signals, for example, modulation signals XMD1 through XMDm.

An output of the first signal copier 724 is applied to the first decoder 726 to be decoded. For example, the first decoder 726 may include a decoder 11 decoding an output of the signal copier 11, a decoder 12 decoding an output of the signal copier 12, . . . , and a decoder 1m decoding an output of the signal copier 1m.

An output of the first decoder 726 is applied to each of a plurality of DUTs, so that the DUTs may be tested at the same time. For example, an output of the decoder 11 may be applied to DUT11 through DUT1n, and an output of the decoder 12 may be applied to DUT21 through DUT 2n. Likewise, an output of the decoder 1m may be applied to DUTm1 through DUTmn. According to the test interface board 820 of FIG. 8, when m pieces of test data TDTA1 through TDTAm are applied through m channels, n times m DUTs may be tested at the same time according to an accurate signal without deterioration of signal characteristics due to impedance mismatching or the like. A large number of DUTs may be accurately tested at the same time.

Figure 9:
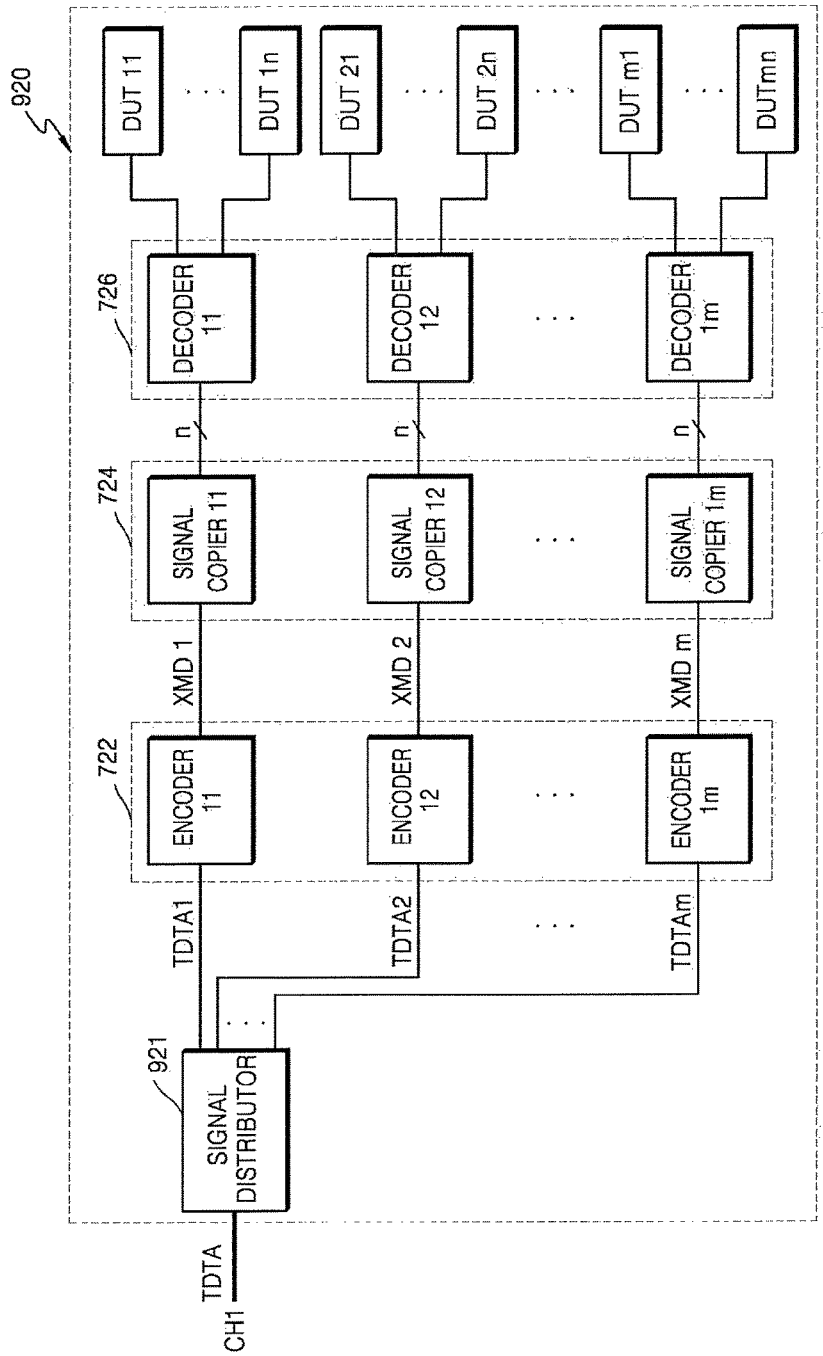
FIG. 9 illustrates another embodiment of a test interface board.

FIG. 9 illustrates an embodiment of a test interface board 920, which is another example of the test interface board 720 of FIG. 7. The test interface board 920 includes a first encoder 722, a first signal copier 724, and a first decoder 726 like the embodiment of FIG. 8. However, the test interface board 920 may further include a signal distributer 921 which distributes test data TDTA, transmitted through a first channel CH1, into m pieces of test data TDTA1 through TDTAm and which supplies the m pieces of test data TDTA1 through TDTAm to the first encoder 722. Other details of the test interface board 920 of FIG. 9 may be the same as those of the test interface board 820 of FIG. 8.

Figure 10:
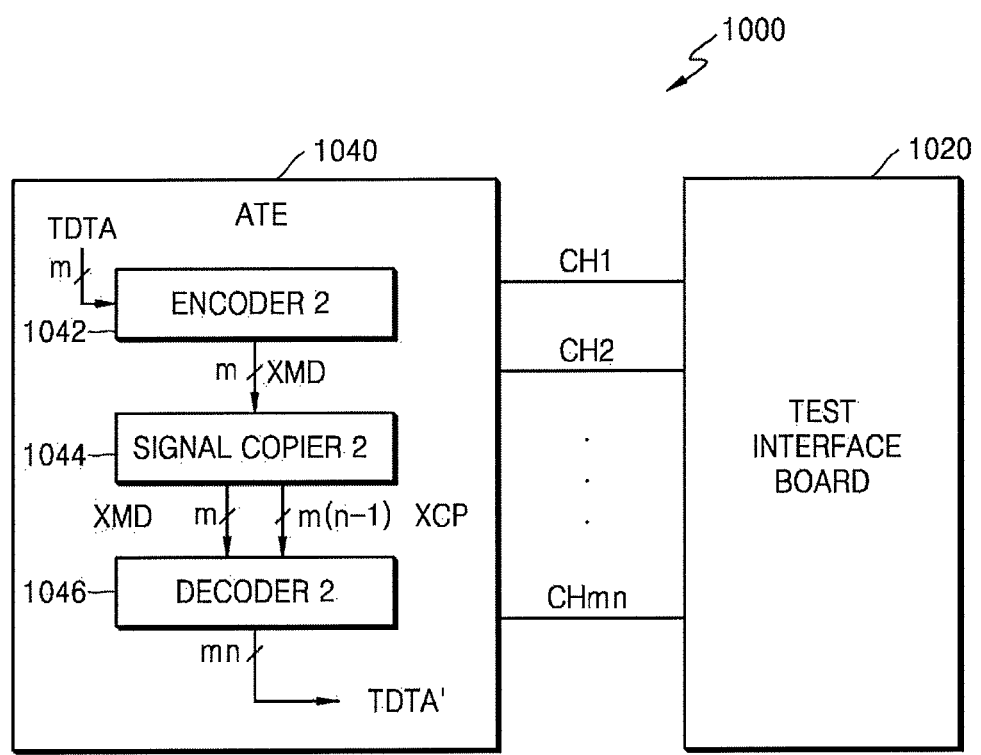
FIGS. 10 to 13 illustrate another embodiment of a test system.

FIG. 10 illustrates an embodiment of a test system 1000 which includes a test interface board 1020 and an ATE 1040. A semiconductor device to be tested may be mounted on the test interface board 1020. Power may be supplied to a power terminal of the semiconductor device to be tested via the test interface board 1020. Also, test data TDTA' from the ATE 1040 may be supplied to a data terminal of the semiconductor device to be tested, via the test interface board 1020.

The ATE 1040 may transmit the test data TDTA' for testing the semiconductor device to be tested to the test interface board 1020 through channels CH1 through CHmn. At a point in time, one piece of test data TDTA' may be transmitted through each of the channels CH1 through CHmn.

The ATE 1040 includes a second encoder 1042, a second signal copier 1044, and a second decoder 1046. The second encoder 1042 may digitally encode test data TDTA (e.g., by Manchester encoding of FIG. 2A or another method) to output the same as a modulation signal XMD. M pieces of test data TDTA may be generated with respect to multiple DUTs that area to be tested at the same time at a point in time using, for example, a test data generator in the ATE 1040. The second signal copier 1044 may inductively couple the modulation signal XMD to copy the same as at least one copy signal XCP. The second decoder 1044 may decode each of the modulation signal XMD and the at least one copy signal XCP to demodulate the same to test data TDTA'. The test data TDTA' obtained by demodulating may be transmitted to the test interface board 1020 via each of the channels CH1 through CHmn.

The ATE 1040 may modulate the m pieces of test data TDTA to m modulation signals XMD that have uniform frequency, regardless of a value of the test data TDTA and no DC component. The ATE 1040 may then copy the m pieces of modulation signals using an inductive coupling method to transmit n times the test data TDTA' to the test interface board 1020, thereby testing more DUTs at the same time in a limited resource environment.

Figure 11:
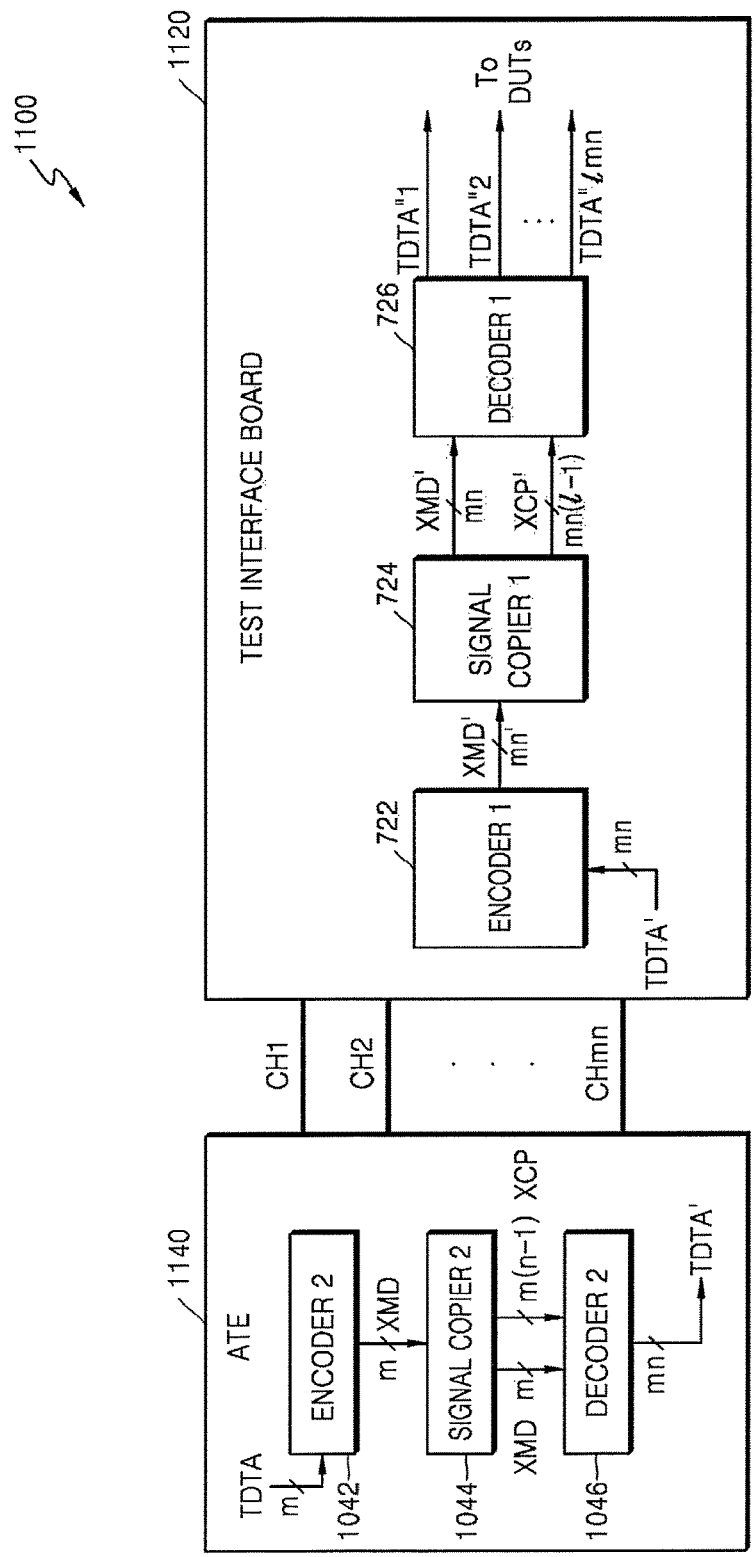

FIG. 11 illustrates another embodiment of a test system 1100 which includes a test interface board 1120 and an ATE 1140. A semiconductor device to be tested may be mounted on the test interface board 1120. Power may be supplied to a power terminal of the semiconductor device to be tested, via the test interface board 1120. Also, test data TDTA' received from the ATE 1140 may be processed using the test interface board 1120 and supplied to a data terminal of the semiconductor device to be tested using the test interface board 1120.

The test interface board 1120 includes a first encoder 722, a first signal copier 724, and a first decoder 726. The first encoder 722 may digitally encode m*n pieces of test data TDTA' from the ATE 1140 to output the same as m*n modulation signals XMD'. The first signal copier 724 inductively couples the m*n modulation signals XMD' to copy them as m*n*(1−1) copy signals XCP'. 1 is an integer equal to or greater than 2. The first decoder 726 may decode each of the m*n modulation signals XMD' and the m*n*(1−1) copy signals XCP' to demodulate the same to test data TDTA"1 through TDTA"1m. Each piece of the test data TDTA"1 through TDTA'1mn obtained by demodulating is applied to semiconductor devices to be tested, that is, to DUTs.

The ATE 1140 may transmit test data TDTA' to the test interface board 1120, via channels CH1 through CHmn, in order to test the semiconductor devices to be tested. At a point in time, one piece of test data TDTA' may be transmitted to each of the channels CH1 through CHmn. The ATE 1140 includes a second encoder 1042, a second signal copier 1044, and a second decoder 1046. The second encoder 1042 may digitally encode test data TDTA to output the same as a modulation signal XMD. M pieces of test data TDTA may be generated by a test data generator (not shown) in the ATE 1140 with respect to a plurality of DUTs that are to be tested at the same time at a point in time. The second signal copier 1044 may inductively couple the modulation signal XMD to copy the same as at least one copy signal XCP. The second decoder 1046 may decode each of the modulation signal XMD and the at least one copy signal XCP to demodulate the same to test data TDTA'. The test data TDTA' obtained by demodulating may be transmitted to the test interface board 1120 via each of the channels CH1 through CHmn.

In one embodiment, the first encoder 722 and the second encoder 1042 may perform encoding using the same encoding method. For example, the first encoder 722 and the second encoder 1042 may both perform encoding by Manchester encoding of FIG. 2A. In another embodiment, the first encoder 722 and the second encoder 1042 may perform encoding using different encoding methods. For example, the first encoder 722 may perform encoding by Manchester encoding of FIG. 2A and the second encoder 1042 may perform encoding by RZ encoding of FIG. 2C. The encoding method may be set based on resources, power, and/or other parameters or characteristics, of the test system 1100. (Different reference numerals are used to label on test data TDTA applied to the first encoder 722, test data TDTA'1 through TDTA'n obtained by demodulating using the first decoder 726, the test data TDTA supplied to the second encoder 1042, and the test data TDTA' obtained by demodulating using the second decoder 1046).

The ATE 1140 may modulate m pieces of test data TDTA to m modulation signals XMD that have uniform frequency, regardless of a value of the test data TDTA, and have no DC component. The ATE 1140 may then copy the m modulation signals XMD using an inductive coupling method and transmit test data TDTA' of a number corresponding to n times to the test interface board 1120. The test interface board 1120 may modulate m*n pieces of the test data TDTA' to m*n modulation signals XMD' that have a uniform frequency and no DC component, and then copy the m*n modulation signals XMD' using an inductive coupling method, thereby testing more DUTs at the same time in a limited resource environment.

Figure 12:
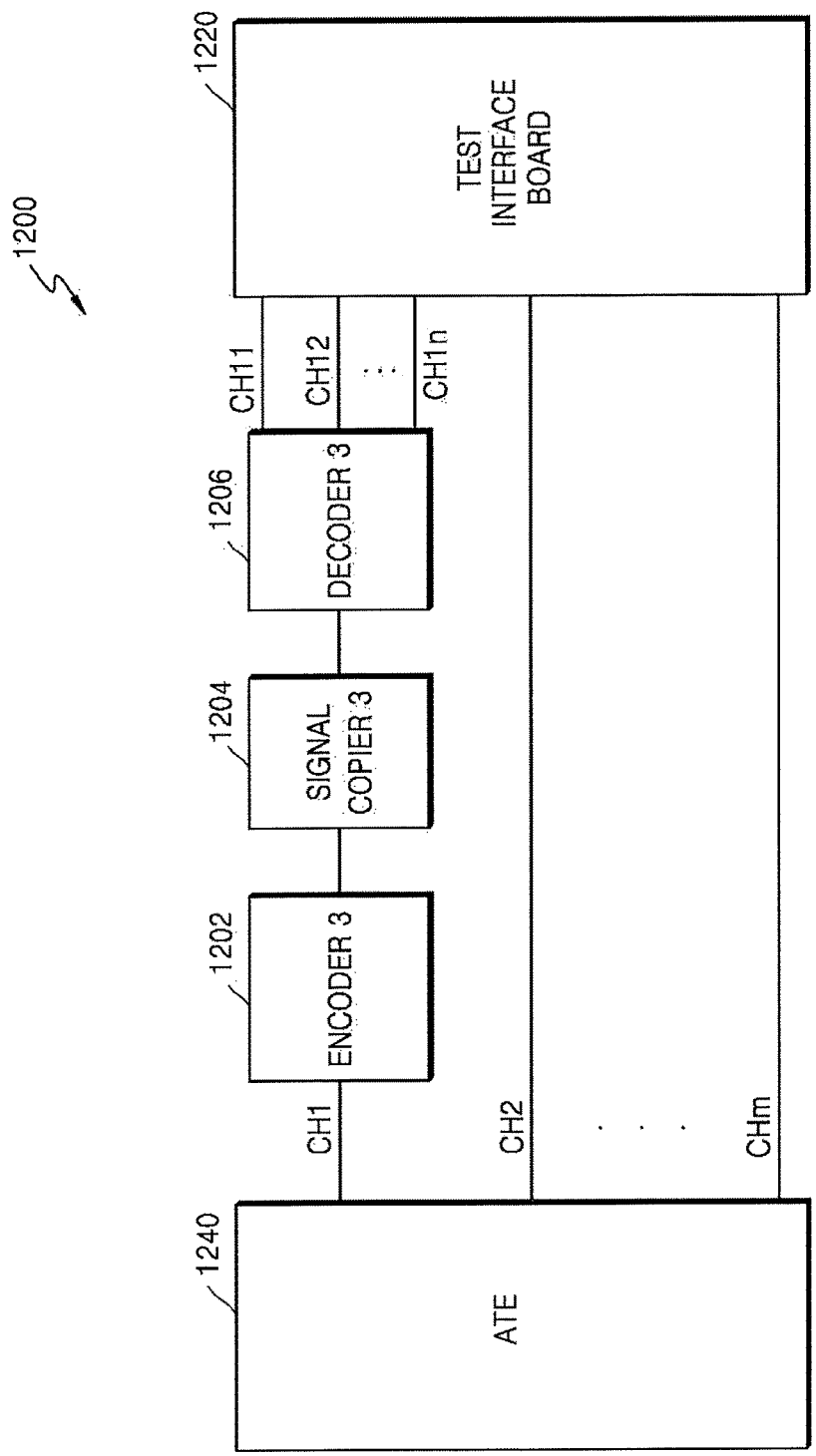

FIG. 12 illustrates another embodiment of a test system 1200 which includes a test interface board 1220 and an ATE 1240. A semiconductor device to be tested may be mounted on the test interface board 1220. Power may be supplied to a power terminal of the semiconductor device to be tested, via the test interface board 1220. Also, test data from the ATE 1240 may be processed using the test interface board 1220 and supplied to a data terminal of the semiconductor device to be tested using test interface board 1220.

The ATE 1240 may transmit m pieces of test data, for testing a semiconductor device to be tested, to the test interface board 1220 via channels C141 through CHmn in. At a point in time, one piece of test data may be transmitted to each of the channels CH1 through CHmn.

The test system 1200 may further include a third encoder 1202, a third signal copier 1204, and a third decoder 1206. The third encoder 1202 detects test data from the first channel CH1 to output the same as a phase-modulated modulation signal. The third signal copier 1204 inductively couples the modulation signal to copy the same as at least one copy signal. The third decoder 1206 decodes the modulation signal and the at least one copy signal. The third encoder 1202, the third signal copier 1204, and the third decoder 1206 operate in a manner similar to the encoders, signal copiers, and the decoders in one or more of the aforementioned embodiments.

In the test system 1200, if the third signal copier 1204 copies a modulation signal and outputs (n−1) copy signals, the number of channels CH11 through CHln connecting the third decoder 1206 and the test interface board 1220 is n times the first channel CH1.

The third encoder 1202, the third signal copier 1204, and the third decoder 1206 are illustrated as included only in the first channel CH1 in FIG. 12. In another embodiment, the test system 1200 may also include the third encoder 1202, the third signal copier 1204, and the third decoder 1206 in every channel or in every two or more channels. As illustrated in FIG. 12, by copying test data by phase-modulating the test data on a channel, an existing ATE and test interface board may be used without change. Also, a signal distribution method performed through inductive coupling may be easily applied.

In some exemplary embodiments, the encoder, the signal copier, and the decoder are all included on the test interface board, in the ATE, or on the channel. In other embodiments, this may not be the case.

Figure 13:
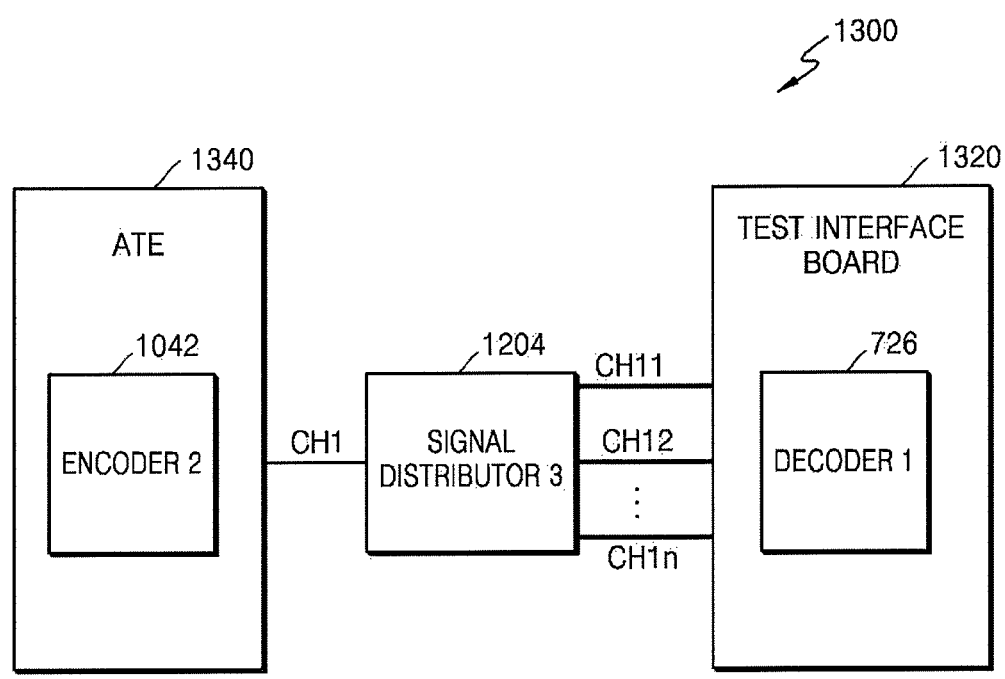

FIG. 13 illustrates another embodiment of a test system 1300 in which the second encoder 1042 may be in ATE 1340, the third signal copier 1204 may be on the first channel CH1, and the first decoder 726 may be on a test interface board 1320. Also, encoders, signal distributors, and decoders may be included at various locations.

Figure 14:
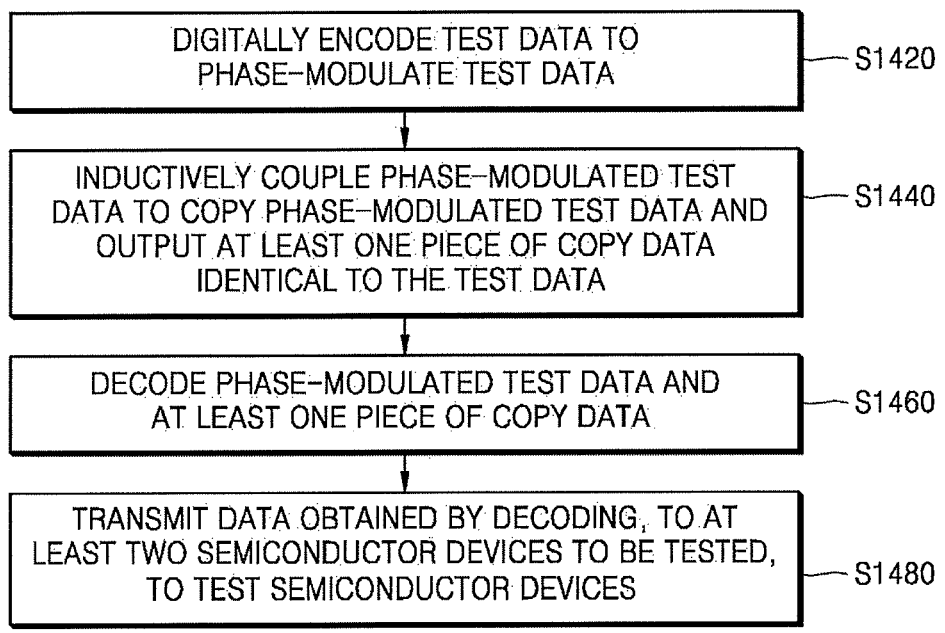
FIG. 14 illustrates an embodiment of a test method.

FIG. 14 illustrates an embodiment of a test method which includes digital encoding test data to phase-modulate the test data (S1420), inductively coupling the phase-modulated test data to copy the same and output at least one copy data identical to the test data (S1440), decoding the phase-modulated test data and the at least one copy data (S1460), and transmitting data obtained by decoding to at least two semiconductor devices to be tested in order to test the semiconductor devices (S1480).

The test method of FIG. 14 may be performed on the test interface board, the ATE, or the channel as described above.

Figure 15:
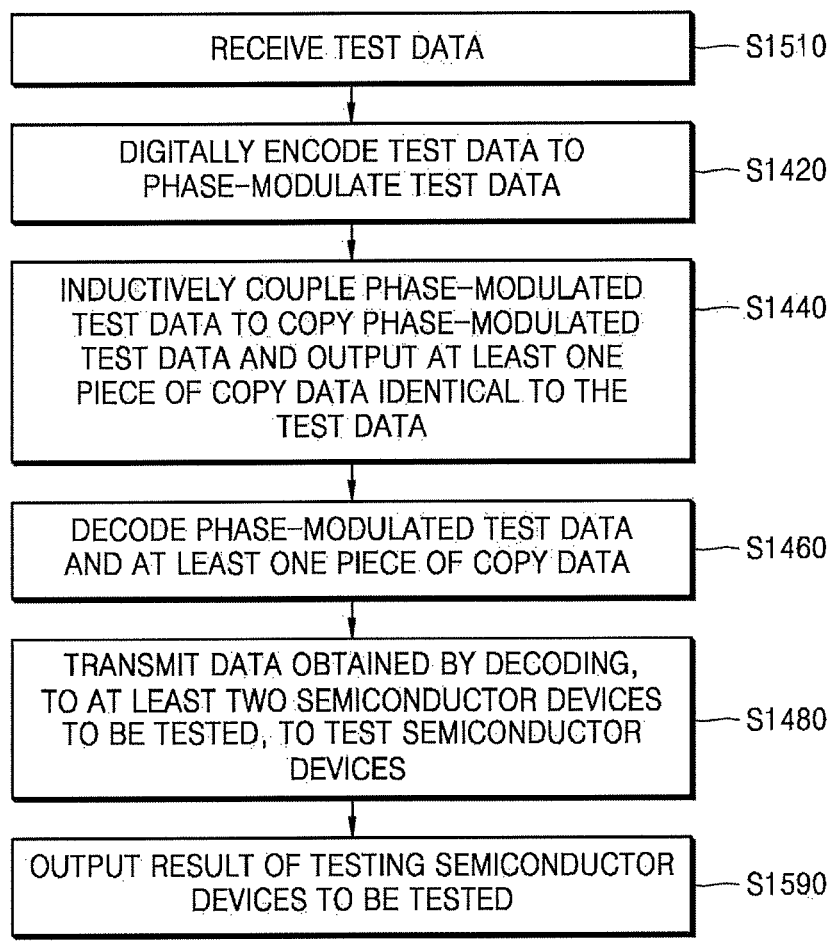
FIG. 15 illustrates another embodiment of a test method.

FIG. 15 illustrates an embodiment of a test method where the test method of FIG. 14 is performed on the test interface board. This method includes receiving test data via the test interface board (S1510) and outputting a result of testing a semiconductor device to be tested (S1590).

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The encoders, decoders, and other processing features of the embodiments disclosed herein may be implemented in logic which, for example, may include hardware, software, or both. When implemented at least partially in hardware, the encoders, decoders, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the encoders, decoders, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A test system, comprising:
   an automatic tester to transmit, via a channel, test data to test at least two semiconductor devices, wherein:
   the at least two semiconductor devices are mounted on a test interface board, and
   the test data are phase-modulated and applied in parallel via inductive coupling to the at least two semiconductor devices, wherein
   the test system further comprises:

an encoder to digitally encode the test data by phase-modulation, and output the encoded test data as a modulation signal;
a signal copier to copy the modulation signal by inductively coupling the modulation signal and to output at least one copy signal identical to the modulation signal; and
a decoder to decode the modulation signal and the at least one copy signal.

2. The test system as claimed in claim 1, wherein:
the encoder, the signal copier, and the decoder are included in the test interface board, and
the decoder is configured to transmit decoded signals respectively corresponding to the modulation signal and the at least one copy signal to the at least two semiconductor devices.

3. The test system as claimed in claim 2, wherein:
the signal copier copies the modulation signal and outputs n−1 copy signals identical to the modulation signal, where n≥2, and
a number of semiconductor devices at a same time is equal to n times a number of channels.

4. The test system as claimed in claim 3, wherein the signal copier includes:
a first signal line to transmit the modulation signal; and
at least one second signal line,
wherein a portion of the at least one second signal line has a first length and is parallel to the first signal line, wherein the portion is patterned, and wherein the at least one copy signal is induced, via the at least one second signal line, based on a change in a magnetic field of the first signal line.

5. The test system as claimed in claim 4, wherein the first length is fixed, regardless of a signal frequency of the test data.

6. The test system as claimed in claim 2, wherein the encoder encodes the test data by Manchester encoding.

7. The test system as claimed in claim 1, wherein:
the encoder, the signal copier, and the decoder are included in the automatic tester, and
the decoder is further configured to transmit decoded signals respectively corresponding to the modulation signal and the at least one copy signal to each of at least two channels.

8. The test system as claimed in claim 7, wherein the signal copier of the automatic tester includes:
a first signal line to transmit the modulation signal; and
at least one second signal line,
wherein a portion of the at least one second signal has a first length and is parallel to the first signal line, wherein the portion is patterned, and wherein the at least one copy signal is induced, via the at least one second signal line, based on a change in a magnetic field of the first signal line.

9. The test system as claimed in claim 8, wherein the first length is fixed, regardless of a signal frequency of the test data.

10. The test system as claimed in claim 7, wherein the encoder of the automatic tester encodes the test data by Manchester encoding.

11. The test system as claimed in claim 1, wherein:
the signal copier copies the modulation signal and outputs n−1 copy signals identical to the modulation signal,
a number of channels electrically connecting the decoder and the test interface board is n times a number of channels electrically connecting the automatic tester and the encoder.

* * * * *